(12) United States Patent
Maangat

(10) Patent No.: US 6,859,064 B1
(45) Date of Patent: Feb. 22, 2005

(54) TECHNIQUES FOR REDUCING LEAKAGE CURRENT IN ON-CHIP IMPEDANCE TERMINATION CIRCUITS

(75) Inventor: Simar Maangat, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/645,788

(22) Filed: Aug. 20, 2003

(51) Int. Cl.$^7$ ............................................. H03K 17/16
(52) U.S. Cl. .......................... 326/30; 326/83; 326/127
(58) Field of Search ............................ 326/26, 27, 30, 326/82, 83, 86, 127

(56) References Cited

U.S. PATENT DOCUMENTS

| | | |
|---|---|---|
| 4,719,369 A | 1/1988 | Asano et al. |
| 4,954,729 A | 9/1990 | Urai |
| 5,111,081 A | 5/1992 | Atallah |
| 5,134,311 A | 7/1992 | Biber et al. |
| 5,164,663 A | 11/1992 | Alcorn |
| 5,179,300 A | 1/1993 | Rolandi et al. |
| 5,359,235 A | 10/1994 | Coyle et al. |
| 5,374,861 A | 12/1994 | Kubista |
| 5,592,510 A | 1/1997 | Van Brunt et al. |
| 5,602,494 A | 2/1997 | Sundstrom |
| 5,623,216 A | 4/1997 | Penza et al. |
| 5,726,582 A | 3/1998 | Hedberg |
| 5,726,583 A | 3/1998 | Kaplinsky |
| 5,764,080 A | 6/1998 | Huang et al. |
| 5,864,715 A | 1/1999 | Zani et al. |
| 5,939,896 A | 8/1999 | Hedberg |
| 5,955,911 A | 9/1999 | Drost et al. |
| 5,970,255 A | 10/1999 | Tran et al. |
| 6,008,665 A | 12/1999 | Kalb et al. |
| 6,026,456 A | 2/2000 | Ilkbahar |
| 6,037,798 A | 3/2000 | Hedberg |
| 6,049,255 A | 4/2000 | Hagberg et al. |
| 6,064,224 A | 5/2000 | Esch, Jr. et al. |
| 6,087,847 A | 7/2000 | Mooney et al. |
| 6,097,208 A | 8/2000 | Okajima et al. |
| 6,100,713 A | 8/2000 | Kalb et al. |
| 6,118,310 A | 9/2000 | Esch, Jr. |
| 6,147,520 A | 11/2000 | Kothandaraman et al. |
| 6,154,060 A | 11/2000 | Morriss |
| 6,157,206 A | 12/2000 | Taylor et al. |
| 6,181,157 B1 | 1/2001 | Fiedler |
| 6,236,231 B1 | 5/2001 | Nguyen |
| 6,252,419 B1 | 6/2001 | Sung et al. |
| 6,329,836 B1 | 12/2001 | Drost et al. |
| 6,356,106 B1 | 3/2002 | Greeff et al. |
| 6,362,644 B1 | 3/2002 | Jeffery et al. |

(List continued on next page.)

OTHER PUBLICATIONS

Altera, Apex 20K "Programmable Logic Device Family," Altera Corporation, Ver. 1.1, May 2001.

(List continued on next page.)

Primary Examiner—Don Le
(74) Attorney, Agent, or Firm—Townsend and Townsend and Crew LLP; Steven J. Cahill

(57) ABSTRACT

Techniques for reducing the leakage currents through on-chip impedance termination circuits are provided. An on-chip impedance termination circuit includes a network of resistors and transistors formed on an integrated circuit. The termination circuit is coupled to one or more IO pins. The transistors can be turned ON and OFF to couple or decouple subsets of the resistors from the IO pins. The bodies of transistors 305–306 are coupled to a supply voltage to cut off leakage current. By pulling the body of these transistors to a supply voltage, the transistor's drain/source-to-body diodes turn OFF preventing unwanted leakage current. Also, by moving the source/drain/body node of transistors 301–304 to Node 2, leakage currents through transistors 301–304 are eliminated.

21 Claims, 4 Drawing Sheets

U.S. PATENT DOCUMENTS

| | | | |
|---|---|---|---|
| 6,366,128 B1 | 4/2002 | Ghia et al. | |
| 6,411,126 B1 | 6/2002 | Tinsley et al. | |
| 6,414,512 B1 | 7/2002 | Moyer | |
| 6,424,169 B1 | 7/2002 | Partow et al. | |
| 6,433,579 B1 | 8/2002 | Wang et al. | |
| 6,445,245 B1 | 9/2002 | Schultz et al. | |
| 6,448,813 B2 | 9/2002 | Garlepp et al. | |
| 6,466,063 B2 | 10/2002 | Chen | |
| 6,489,837 B2 | 12/2002 | Schultz et al. | |
| 6,504,397 B1 * | 1/2003 | Hart et al. | 326/30 |
| 6,586,964 B1 | 7/2003 | Kent et al. | |
| 6,590,413 B1 | 7/2003 | Yang | |
| 6,603,329 B1 | 8/2003 | Wang et al. | |
| 6,639,397 B2 | 10/2003 | Roth et al. | |
| 6,642,741 B2 * | 11/2003 | Metz et al. | 326/30 |
| 6,686,772 B2 * | 2/2004 | Li et al. | 326/83 |
| 6,710,618 B1 * | 3/2004 | Murray | 326/30 |
| 6,766,155 B2 * | 7/2004 | Salcido et al. | 455/282 |
| 2002/0010853 A1 | 1/2002 | Trimberger et al. | |
| 2002/0060602 A1 | 5/2002 | Ghia et al. | |
| 2002/0101278 A1 | 8/2002 | Schultz et al. | |
| 2003/0062922 A1 | 4/2003 | Douglass et al. | |
| 2004/0008054 A1 | 1/2004 | Lesea et al. | |

OTHER PUBLICATIONS

Altera, Apex II "Programmable Logic Device Family," Altera Corporation, Ver. 1.1, May 2001.

Bendak, M. et al. (1996). "CMOS VLSI Implementation of Gigabyte/second computer network links," Dept. of Electrical and Computer Engineering, University of California at San Diego, La Jolla, CA 92093–0407, IEEE *International Symposium on Circuits and Systems* pp. 269–272.

Boni, A. et al. (2001). "LVDS I/O Interface for Gb/s–per–Pin Operation in 0.35–um CMOS," IEEE Journal of Solid–State Circuits, 38(4):706–711.

Esch and Manley, Theory and Design of CMOS HSTL I/O Pads, The Hewlett Packard Journal, Aug. 1998.

Xilinx, "Spartan–3 1.2V FPGA Family: Functional Description," Xilinx, DS099–2 (v1.2) Jul. 11, 2003.

Xilinx, "Virtex–II 1.5V Field Programmable Gate Arrays," Xilinx, DSO3102 (v1.5), Apr. 2, 2001.

Xilinx, "Virtex–II Platform FPGAs: Detailed Description," Xilinx, DS031–2 (v3.1) Oct. 14, 2003.

Xilinx, "Virtex–II Pro Platform FPGAs: Functional Description," Xilinx, DS083–2 (v2.9) Oct. 14, 2003.

* cited by examiner

TECHNIQUES FOR REDUCING LEAKAGE CURRENT IN ON-CHIP IMPEDANCE TERMINATION CIRCUITS

BACKGROUND OF THE INVENTION

The present invention relates to techniques for reducing leakage current, and more particularly, to techniques for reducing leakage current through transistors in an on-chip impedance termination circuit.

Integrated circuits have input/output (IO) pins that are used to transmit signals into and out of the circuit. An external termination resistor is usually coupled to each IO pin to provide impedance termination. An impedance termination resistor reduces reflection of input signals on a signal line coupled to an IO pin. Signal reflection causes signal distortion and degrades overall signal quality.

The use of external resistors for termination purposes can be cumbersome and costly, especially for integrated circuits that have numerous IO pins. For example, external resistors typically use a substantial amount of board space. As a result, on-chip impedance termination techniques have been developed, because they occupy less board space.

Prior art integrated circuits have provided on-chip impedance termination by coupling a field-effect transistor to an IO pin. The gate voltage of the transistor is controlled by a calibration circuit to regulate the impedance of the on-chip transistor. On-chip transistors have also been applied across differential IO pins to provide impedance termination.

However, transistors that control on-chip impedance termination circuits can leak unwanted current through their drain/source-to-body diodes even when the transistors are disabled. Therefore, it would be desirable to provide on-chip impedance termination circuits that have reduced leakage current.

BRIEF SUMMARY OF THE INVENTION

The present invention provides techniques for reducing the leakage current through on-chip impedance termination circuits. An on-chip impedance termination circuit of the present invention includes a network of resistors and transistors formed on an integrated circuit. The impedance termination circuit is coupled to one or more IO pins. The transistors can be turned ON and OFF to couple or decouple one or more of the resistors from the IO pins.

According to the present invention, all of the current paths in the impedance termination circuit are directed through a subset of the transistors (e.g., 2 transistors). The body region of each of the subset of transistors is coupled to a supply voltage to cut off leakage current. By pulling the body regions of these transistors to a supply voltage, their drain/source-to-body diodes are turned OFF to prevent unwanted leakage current. The body connection of the remaining transistors is changed such that junction leakage currents through these transistors are also eliminated.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
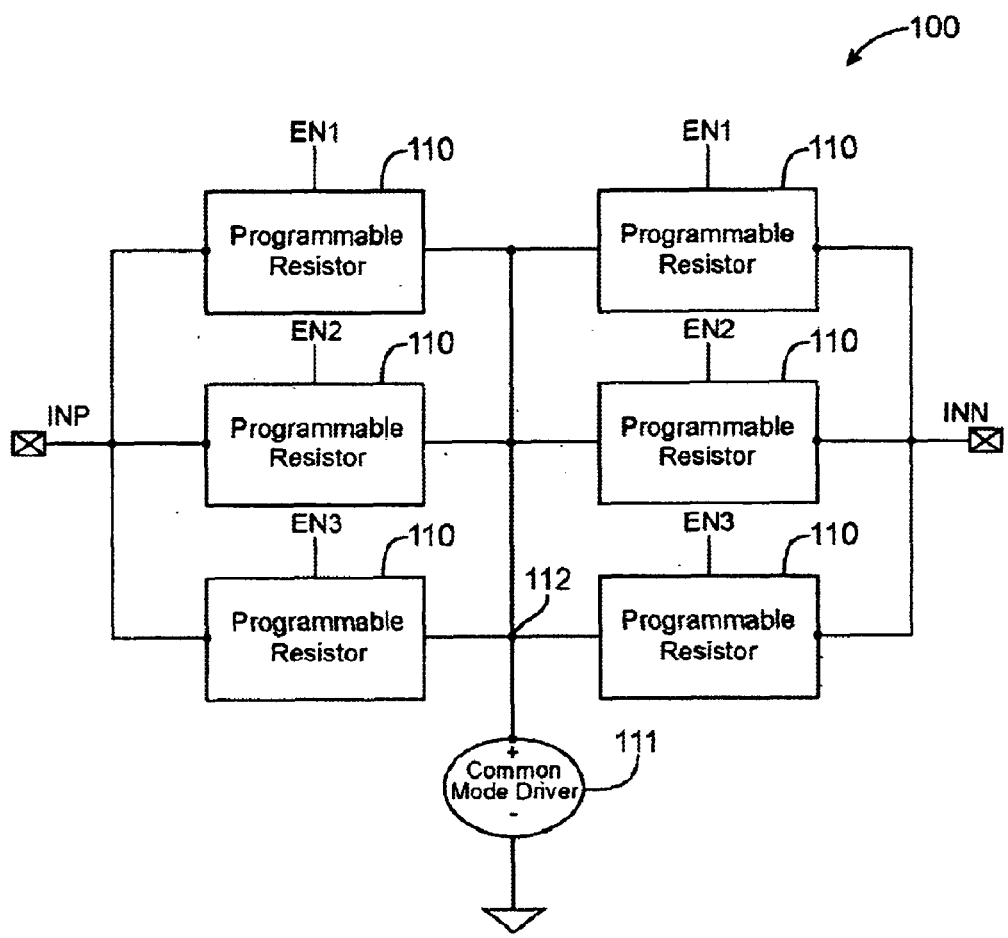
FIG. 1 illustrates a block diagram of an on-chip impedance termination circuit according to an embodiment of the present invention.

FIG. 1 illustrates an on-chip programmable termination impedance circuit 100 according to an embodiment of the present invention. Termination impedance circuit 100 is formed on an integrated circuit such as an application specific integrated circuit (ASIC), a programmable logic device (PLD), a field programmable gate array (FPGA), a programmable gate array (PLA), or a configurable logic array.

Termination impedance circuit 100 is coupled between two differential input/output (IO) pins INP and INN. IO pins INN and INP are driven by driver circuitry (not shown) between two supply voltage levels. The two supply voltage levels include a high supply voltage, VCC, and a low supply voltage, Ground.

Termination impedance circuit 100 provides impedance termination to transmission lines coupled to IO pins INN and NP. Termination impedance circuit 100 can also provide impedance matching to transmission lines coupled to IO pins INN and INP. The impedance of circuit 100 can be set to match the impedance of the transmission lines to reduce signal reflection.

Termination impedance circuit 100 includes programmable resistor circuits 110, which are discussed in further detail below. A user of the integrated circuit can program programmable resistor circuits 110 to provide a desired termination resistance value across IO pins INN and INP.

Termination impedance circuit 100 also includes common mode driver circuit 111. Common mode driver 111 generates a common mode voltage at node 112. The common mode voltage is in between the high supply voltage VCC and the low supply voltage Ground.

Figure 2:
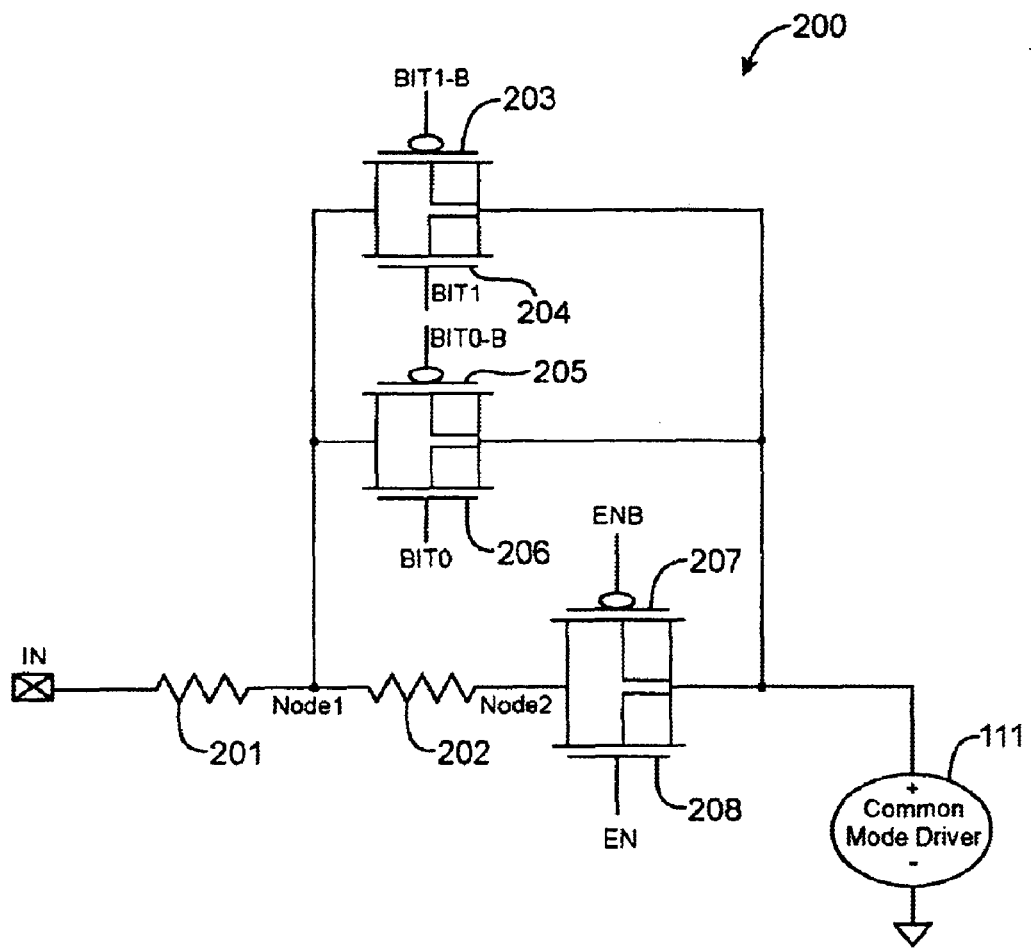
FIG. 2 illustrates a schematic of an on-chip impedance termination circuit that can conduct unwanted leakage current.

An example of impedance termination circuit 100 is illustrated in FIG. 2. FIG. 2 illustrates an on-chip programmable termination circuit 200. Circuit 200 includes field-effect transistors 203, 204, 205, 206, 207, and 208, and resistors 201–202. Circuit 200 is coupled to an IO pin IN. Pin IN can be pin INN or pin INP.

N-channel transistor 204 and p-channel transistor 203 form a first pass gate that is controlled by signal BIT1 and its compliment BIT1_B. N-channel transistor 206 and p-channel transistor 205 form a second pass gate that is controlled by signal BIT0 and its compliment BIT0_B. N-channel transistor 208 and p-channel transistor 207 form a third pass gate that is controlled by enable signal EN and its compliment ENB.

When transistors 207 and 208 are ON, current flows through resistors 201–202 between pin IN and common mode driver 111. When transistors 203/204 or transistors 205/206 are ON, current flows through resistor 201 between pin IN and common mode driver 111. Turning transistors 203/204 or transistors 205/206 ON provides an alternate current path around resistor 202 that reduces the net resistance of circuit 200.

Transistors 203–208 are turned OFF to block the flow of current between pin IN and common mode driver 111. However, even when transistors 203–208 are OFF, unwanted leakage current can flow between pin IN and common mode driver 111. The body (i.e., bulk) regions of each of transistors 203–208 are coupled to common mode driver circuit 111.

When the voltage on pin IN is near supply voltage VCC, unwanted leakage current flows through the drain/source-to-body diodes of p-channel transistors 203, 205, and 207. When the voltage on pin IN is near ground, unwanted leakage current flows through the drain/source-to-body diodes of n-channel transistors 204, 206, and 208. The leakage current causes unnecessary power consumption.

The leakage current also causes inaccurate termination resistance. For example, if in FIG. 1, two of the resistors blocks (110) are turned off using enable signal EN, in order to get a higher termination resistance because fewer blocks 110 are in parallel with each other. However, there can be a leakage current flowing through the body regions of transistors 203–208 in the blocks 110 that are supposed to be shut off. The resistor blocks 110 that are supposed to be shut off are not completely OFF for high input signal swings. That means the resistive paths through those blocks 110 are not actually an open circuit and are contributing to the overall impedance, which causes an inaccurate termination impedance.

Figure 3:
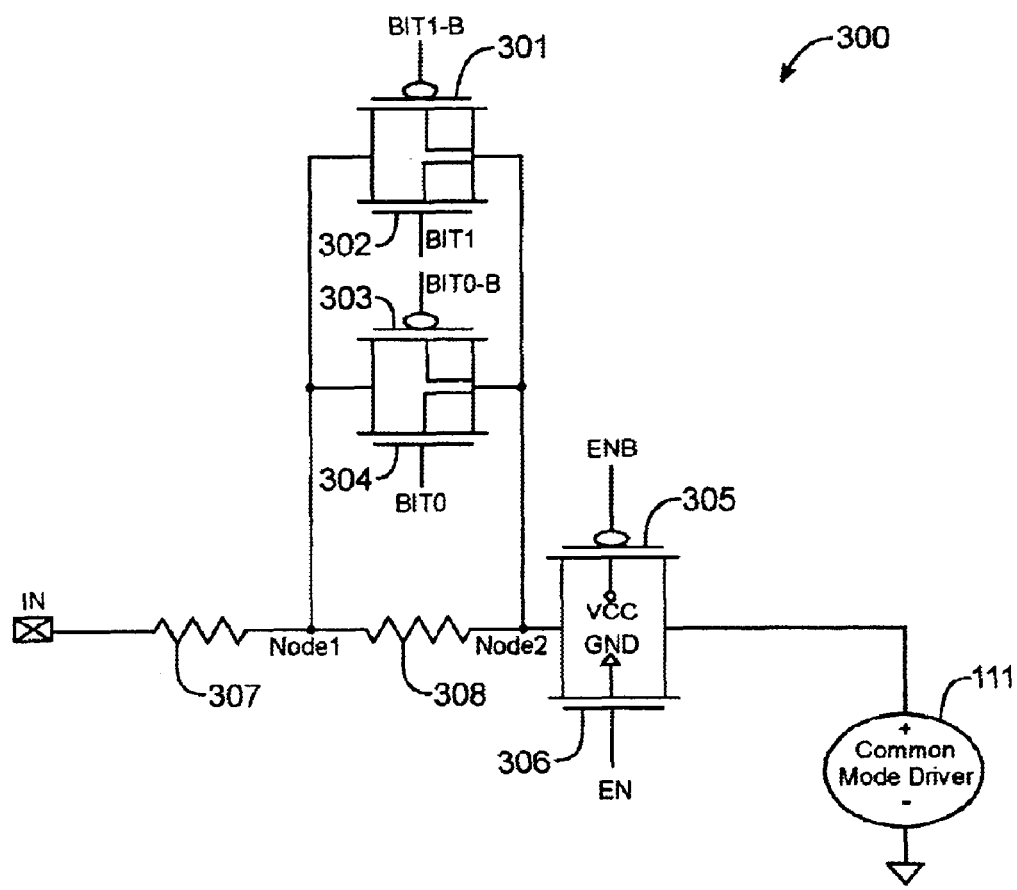
FIG. 3 illustrates a schematic of an on-chip impedance termination circuit that prevents unwanted leakage current according to an embodiment of the present invention.

Impedance termination circuits of the present invention block the unwanted leakage current through transistors in programmable termination resistor circuits 110. FIG. 3 illustrates an embodiment of an impedance termination circuit 300 of the present invention. Circuit 300 is an example of programmable resistor circuits 110 in FIG. 1.

Circuit 300 includes field-effect transistors 301, 302, 303, 304, 305, 306, and resistors 307–308. N-channel transistor 302 and p-channel transistor 301 form a first pass gate that is controlled by signal BIT1 and its compliment BIT1_B. N-channel transistor 304 and p-channel transistor 303 form a second pass gate that is controlled by signal BIT0 and its compliment BIT0_B. N-channel transistor 306 and p-channel transistor 305 form a third pass gate that is controlled by enable signal EN and its compliment ENB. Signals BIT0, BIT1, BIT0_B BIT1_B, EN, and ENB can be generated by memory or logic elements on a field programmable gate array. Pass gate 305/306 is turned ON to enable impedance termination circuit 300, and turned OFF to disable circuit 300.

Transistors 301–304 are coupled across both terminals of resistor 308 as shown in FIG. 3. Therefore, transistors 301–304 cannot bypass the current paths through transistors 305–306. Thus, when transistors 305/306 are both OFF, current flow between pin IN and common mode driver 111 is blocked. When transistors 305/306 are ON, current can flow between pin IN and common mode driver circuit 111.

Transistors 301–304 are coupled in parallel with resistor 308. One or more of transistors 301–304 can be turned ON to modulate the termination resistance provided by circuit 300.

The body regions of transistors 305–306 are coupled to a supply voltage as shown in FIG. 3. The body of P-channel transistor 305 is coupled to the high supply voltage VCC. The body of N-channel transistor 306 is coupled to ground (the low supply voltage).

The drain/source-to-body diode (also called the body diode) within p-channel transistor 305 includes a P-N junction between the drain (or source) region and the body region of the transistor. Coupling the N-type body region to VCC prevents the drain/source-to-body diode from becoming forward biased when the voltage at pin IN is near VCC. Therefore, leakage current cannot flow through the drain/source-to-body diode of transistor 305 when transistor 305 is OFF.

The drain/source-to-body diode within n-channel transistor 306 also includes a P-N junction between the drain (or the source) region and the body region of the transistor. Coupling the P-type body region to ground prevents the drain/source-to-body diode from becoming forward biased when the voltage at pin IN is near ground. Therefore, leakage current cannot flow through the drain/source-to-body diode of transistor 306 when transistor 306 is OFF.

When transistors 305 and 306 are OFF, current flow between pin IN and common mode driver 111 is completely blocked. No leakage current flows through the channels or the body diodes of transistors 305 and 306.

According to the present invention, all of the current paths in impedance termination circuit 300 are directed through transistors 305 and 306, and the body diodes of transistors 305–306 are prevented from becoming forward biased. By coupling the body regions of transistors 305–306 to supply voltages VCC and ground, respectively, the body diodes of transistors 305–306 are prevented from conducting leakage current through circuit 300.

In FIG. 2, the drain/source/body terminals of transistors 203–206 are coupled to common mode driver 111. According to the present invention, the drain/source/body terminals of transistors 301–304 are coupled to node 2 as shown in FIG. 3. By coupling the drain/source/body terminals of transistors 301–304 to node 2, leakage current cannot flow through the source/drain/body diodes of transistors 301–304 when these transistors are OFF. This is because Node 2 gets pulled to the same potential as the pin when this resistor is OFF, i.e., when all transistors 301–306 are shut off. With this configuration, the junction voltage across source/body or drain/body diodes of 301–304 is almost zero when the resistor is OFF, which eliminates the junction leakage currents. This was not the case in FIG. 2, in which there was leakage through the diode junctions when the resistor was OFF.

The present invention provides techniques for blocking leakage current in on-chip impedance termination circuits to reduce power consumption. The body of transistor 305 is pulled up to supply voltage VCC. Circuit 300 substantially reduces the net power consumption by blocking the body diode leakage currents.

In FIG. 3, each of the impedance termination circuits 110 of FIG. 1 can include the circuitry 300 shown in FIG. 3. Thus, there are three pass gates 305/306 and three sets of termination resistors 307/308 coupled between common mode driver 111 and pin INP in circuit 100. There are also three pass gates 305/306 and three sets of termination resistors 307/308 coupled between common mode driver 111 and pin INN in circuit 100.

FIG. 3 illustrates merely one embodiment of the present invention. As will be understood by one of skill in the art, the present invention includes many other embodiments. For example, an impedance termination circuit 110 of the present invention can include one termination resistor. Impedance termination circuit 110 can also include three or more termination resistors. The present invention can also include more pass gates or single transistors that are coupled in parallel with the additional termination resistors.

The present invention also includes integrated circuits that have more or less than 6 termination impedance circuits 110. The present invention includes circuits that apply on-chip impedance termination to one pin or to two differential pins.

Figure 4:
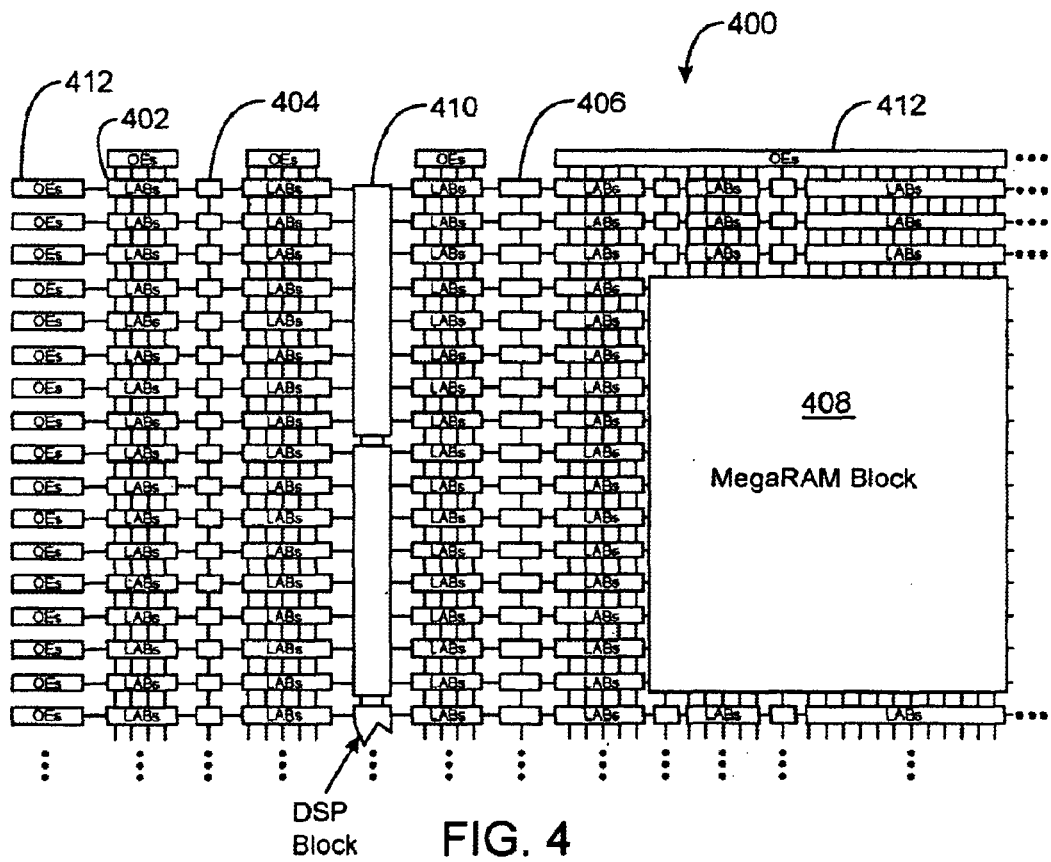
FIG. 4 is a simplified block diagram of a programmable logic device that can implement embodiments of the present invention.

FIG. 4 is a simplified partial block diagram of an exemplary high-density PLD/FPGA 400 wherein techniques according to the present invention can be utilized. PLD 400 includes a two-dimensional array of programmable logic array blocks (or LABs) 402 that are interconnected by a network of column and row interconnects of varying length and speed. LABs 402 include multiple (e.g., 10) logic elements (or LEs), an LE being a small unit of logic that provides for efficient implementation of user defined logic functions.

PLD 400 also includes a distributed memory structure including RAM blocks of varying sizes provided throughout the array. The RAM blocks include, for example, 512 bit blocks 404, 4K blocks 406 and a MegaBlock 408 providing 512K bits of RAM. These memory blocks may also include shift registers and FIFO buffers. PLD 400 further includes digital signal processing (DSP) blocks 410 that can implement, for example, multipliers with add or subtract features. I/O elements (IOEs) 412 located, in this example, around the periphery of the device support numerous single-ended and differential I/O standards. It is to be understood that PLD 400 is described herein for illustrative purposes only and that the present invention can be implemented in many different types of PLDs, FPGAs, and the like.

Figure 5:
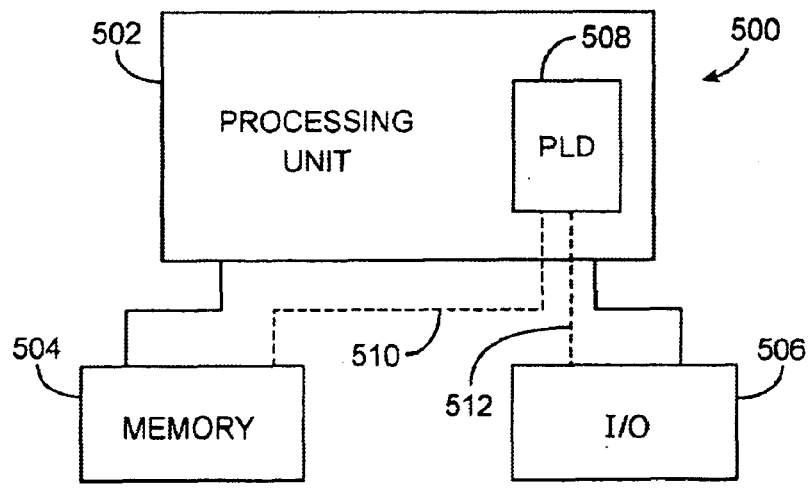
FIG. 5 is a block diagram of an electronic system that can implement embodiments of the present invention.

While PLDs of the type shown in FIG. 4 provide many of the resources required to implement system level solutions, the present invention can also benefit systems wherein a PLD is one of several components. FIG. 5 shows a block diagram of an exemplary digital system 500, within which the present invention may be embodied. System 500 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 500 may be provided on a single board, on multiple boards, or within multiple enclosures.

System 500 includes a processing unit 502, a memory unit 504 and an I/O unit 506 interconnected together by one or more buses. According to this exemplary embodiment, a programmable logic device (PLD) 508 is embedded in processing unit 502. PLD 508 may serve many different purposes within the system in FIG. 5. PLD 508 can, for example, be a logical building block of processing unit 502, supporting its internal and external operations. PLD 508 is programmed to implement the logical functions necessary to carry on its particular role in system operation. PLD 508 may be specially coupled to memory 504 through connection 510 and to I/O unit 506 through connection 512.

Processing unit 502 may direct data to an appropriate system component for processing or storage, execute a program stored in memory 504 or receive and transmit data via I/O unit 506, or other similar function. Processing unit 502 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 508 can control the logical operations of the system. In an embodiment, PLD 508 acts as a reconfigurable processor, which can be reprogrammed as needed to handle a particular computing task. Alternately, programmable logic device 508 may itself include an embedded microprocessor. Memory unit 504 may be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications can be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. An integrated circuit comprising a first impedance termination circuit, the first impedance termination circuit comprising:
   a first termination resistor coupled to a first input/output pin on the integrated circuit;
   a common mode driver; and
   a first transistor coupled between the first termination resistor and the common mode driver, the first transistor blocking current flow through the first termination resistor when the first transistor is OFF;
   wherein a body of the first transistor is coupled to a first supply voltage.

2. The integrated circuit according to claim 1 further comprising:
   a second transistor coupled in parallel with the first transistor that blocks current flow through the first termination resistor when the first and the second transistors are OFF,
   wherein a body of the second transistor is coupled to a second supply voltage.

3. The integrated circuit according to claim 1 wherein the first impedance termination circuit further comprises:
   a first pass gate coupled in parallel with the first termination resistor.

4. The integrated circuit according to claim 3 wherein the first termination impedance circuit further comprises:
   a second pass gate coupled in parallel with the first termination resistor and the first pass gate.

5. The integrated circuit according to claim 3 wherein a second termination resistor is coupled in series with the first termination resistor and the first pass gate.

6. The integrated circuit according to claim 1 further comprising a second impedance termination circuit, the second impedance termination circuit comprising:
   a second termination resistor coupled to a second input/output pin on the integrated circuit; and
   second and third transistors coupled in parallel between the second termination resistor and the common mode driver, the second and the third transistors blocking current flow through the second termination resistor when the second and the third transistors are OFF;
   wherein a body of the second transistor is coupled to the first supply voltage, and a body of the third transistor is coupled to a second supply voltage.

7. The integrated circuit according to claim 6 wherein the second impedance termination circuit further comprises:
   first and second pass gates coupled in parallel with the second termination resistor; and
   a third termination resistor coupled in series between the second termination resistor and the second pin.

8. The integrated circuit according to claim 6 fiuther comprising a third impedance termination circuit, the third impedance termination circuit comprising:
   a third termination resistor coupled to the first input/output pin; and
   fourth and fifth transistors coupled in parallel between the third termination resistor and the common mode driver, the fourth and the fifth transistors blocking current flow through the third termination resistor when the fourth and the fifth transistors are OFF;
   wherein a body of the fourth transistor is coupled to the first supply voltage, and a body of the fifth transistor is coupled to the second supply voltage.

9. The integrated circuit according to claim 8 further comprising a fourth impedance termination circuit, the fourth impedance termination circuit comprising:
   a fourth termination resistor coupled to the second input/output pin; and
   sixth and seventh transistors coupled in parallel between the fourth termination resistor and the common mode driver, the sixth and the seventh transistors blocking current flow through the fourth termination resistor when the sixth and the seventh transistors are OFF;
   wherein a body of the sixth transistor is coupled to the first supply voltage, and a body of the seventh transistor is coupled to the second supply voltage.

10. The integrated circuit according to claim 1 wherein the integrated circuit is a field programmable gate array.

11. A method for providing termination impedance to a first pin using a first termination resistor on an integrated circuit, the method comprising:
   turning OFF a first pass gate to block current through the first termination resistor on the integrated circuit, wherein the first pass gate includes first and second transistors;
   driving a voltage on the first pin to high and low supply voltages while the first pass gate is OFF; and
   preventing leakage current from flowing through drain/source-to-body diodes of the first and the second transistors while the first pass gate is OFF.

12. The method as defined in claim 11 wherein preventing the leakage current from flowing further comprises:
   coupling a body region of the first transistor to the high supply voltage and a body region of the second transistor to the low supply voltage.

13. The method as defined in claim 11 further comprising:
   turning ON the first pass gate to provide a current path through the termination resistors; and
   turning ON a second pass gate coupled in parallel with the first termination resistor.

14. The method as defined in claim 13 further comprising:
   turning ON a third pass gate coupled in parallel with the first termination resistor, wherein a second termination resistor is coupled between the first pin and the first termination resistor.

15. The method as defined in claim 11 further comprising:
   turning OFF a second pass gate to block current through a second termination resistor on the integrated circuit, wherein the second termination resistor provides termination impedance to a second pin, and the first pass gate includes third and fourth transistors;
   driving a voltage on the second pin to the high and the low supply voltages while the second pass gate is OFF; and
   preventing leakage current from flowing through drain/source-to-body diodes of the third and the fourth transistors while the second pass gate is OFF.

16. The method as defined in claim 15 wherein the first and the second pass gates are coupled to a common mode driver.

17. The method as defined in claim 15 wherein preventing the leakage current from flowing through the third and the fourth transistors further comprises:
   coupling a body region of the third transistor to the high supply voltage and a body region of the fourth transistor to the low supply voltage.

18. A method for providing termination impedance on an integrated circuit, the method comprising:
   providing a current path through a first on-chip resistor to a pin of the integrated circuit;
   blocking current flow through the first on-chip resistor by turning OFF a first transistor; and
   preventing source/drain-to-body diodes of the first transistor from becoming forward biased in response to voltage changes on the pin.

19. The method of claim 18 wherein preventing the source/drain-to-body diodes of the first transistor from becoming forward biased further comprises:
   coupling a body region of the first transistor to a first supply voltage.

20. The method of claim 19 wherein blocking the current flow through the first on-chip resistor further comprises:
   turning OFF a second transistor coupled in parallel with the first transistor; and
   preventing the source/drain-to-body diodes of the second transistor from becoming forward biased in response to voltage changes on the pin.

21. The method of claim 20 wherein preventing the source/drain-to-body diodes of the second transistor from becoming forward biased further comprises:
   coupling a body region of the second transistor to a second supply voltage.

* * * * *